(12) United States Patent
Blosse et al.

(10) Patent No.: US 6,979,640 B1
(45) Date of Patent: Dec. 27, 2005

(54) CONTACT STRUCTURE AND METHOD OF MAKING THE SAME

(75) Inventors: Alain Blosse, Belmont, CA (US); Sanjay Thekdi, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/112,572

(22) Filed: Mar. 29, 2002

(51) Int. Cl.[7] ......................................... H01L 21/4763
(52) U.S. Cl. ...................................... 438/634; 438/637
(58) Field of Search .............................. 438/634, 624, 438/637–640

(56) References Cited

U.S. PATENT DOCUMENTS

| | | | | |
|---|---|---|---|---|
| 5,858,875 A | * | 1/1999 | Chung et al. | 438/634 |
| 6,020,258 A | * | 2/2000 | Yew et al. | 438/634 |
| 6,071,773 A | * | 6/2000 | Lee et al. | 438/253 |
| 6,309,971 B1 | | 10/2001 | Geha | 438/688 |
| 6,436,850 B1 | * | 8/2002 | Morales | 438/781 |
| 6,465,341 B1 | * | 10/2002 | Pramanick | 438/622 |
| 2001/0055853 A1 | * | 12/2001 | Tanigami et al. | 438/424 |

OTHER PUBLICATIONS

Kirk-Othmer, 1995, "Encyclopedia of Chemical Technology", 14:677-709.
Van Zant, Peter, 2000, "Microchip Fabrication: A Practical Guide to Semiconductor Processing", 3th ed., pp. 491-527.

* cited by examiner

Primary Examiner—Jennifer Kennedy
(74) Attorney, Agent, or Firm—Evan Law Group LLC

(57) ABSTRACT

A method of making a semiconductor structure comprises forming a hole through a first dielectric layer; followed by forming a hole through an etch-stop layer, to expose a first conducting layer. The thickness of the etch-stop layer is at least one-half the smallest line width of the first conducting layer.

17 Claims, 4 Drawing Sheets

CONTACT STRUCTURE AND METHOD OF MAKING THE SAME

BACKGROUND

The present invention relates to interconnection structures, including interlevel interconnection structures, devices containing these structures, and methods of making these structures and devices.

Typically, interconnection structures between conducting layers in an integrated circuit are known as contacts or vias (hereinafter "vias"), which are usually metallic structures that have ends in electrical contact with the conducting layers. The vias are typically formed by depositing a dielectric layer over a first conducting layer, etching a hole through the dielectric layer, filling the holes with a conductive material to form the vias, then etching or polishing away any excess conductor material. If the via material differs from that of the overlying conducting layer, then one typically forms the overlying conducting layer separately, on top of the vias and the dielectric material after removing the excess conductive material of the vias. The first conducting layer will be on an insulating layer (usually phosphorous silicate glass) that is itself on the active layer that contains transistors, etc.; this first conducting layer will have contacts to the transistors, etc.

Typically, contact structures are designed so that they are fully enclosed by the first conducting layer (when viewed from above). The probability that a contact feature will be fully enclosed can be calculated from the distributions of critical dimension (CD) target for the contact and the first conducting layer, and the alignment tolerance of the first conducting layer to the contact; it is assumed that any case where the metal does not fully cover the contact results in yield loss. Therefore, a relation between the drawn overlap and the alignment yield is now set. This gives the Lynch equation (I), where overlap is the Lynch value:

$$\text{overlap} = \sigma_f \times (B^2 + 1)^{1/2} \times \left\{ \ln\left[(1 - y_a)^{-1} \times \left(\frac{1}{B^2} + 1\right)^{-1/2}\right] \right\}^{1/2}, \quad (I)$$

where $$B = \frac{\sqrt{n} \times \sigma_m}{\sqrt{2} \times \left(\frac{\sigma_f}{2}\right)}$$

$\sigma_f$=std. deviation of linewidth
$\sigma_m$=std. deviation of misalignment
n=number of alignments
$y_a$=alignment yield Borderless contacts are contacts that are formed without using a structure which prevents any portion of the via from landing outside of the intended contact area. A typical borderless contact structure, formed as designed, is illustrated in FIG. 4. Shown in this figure are a phosphorous silicate glass layer 2 (which is on the semiconductor substrate), a capping oxide layer 4, titanium local interconnections 6, an interlayer dielectric oxide layer 8, and an aluminum conducting layer 16. Also shown is via 14 of tungsten and a via liner 12 of TiN, which electrically connects the conducting layer and the local interconnections. Optionally, the via may be filled with the aluminum of the conducting layer, in which case the liner may act as a seed layer.

This structure may be formed by the process illustrated in FIGS. 1–3. First, the phosphorous silicate glass layer 2 is formed, followed by forming a capping oxide layer 4, and a titanium layer. The titanium layer is patterned to form the titanium local interconnections 6, as shown in FIG. 1. Next, an interlayer dielectric oxide layer 8 is formed by low temperature (LT) chemical vapor deposition (CVD) on the substrate. This layer is planarized by chemical-mechanical polishing (CMP), and optionally, an oxide capping layer may also be applied (not illustrated), as shown in FIG. 2. A photoresist layer is then applied and patterned for the via definition, and an oxide etch is used to form the hole 10 usually with 100% overetch to remove all oxide at the bottom of the hole, and then the photoresist is removed, as shown in FIG. 3. Next, this hole is lined with TiN, typically by CVD or physical vapor deposition (PVD), to form the via liner 12, and the via filled with tungsten by CVD, followed by CMP, to complete formation of the via 14. Finally, the aluminum conducting layer 16 is formed. This aluminum based conducting layer may be patterned, and additional conducting layers, separated by dielectric layers, may be formed and patterned.

Fully enclosed contacts may suffer from disadvantages. The landing area of the via on the local interconnects should be large enough so that they are fully enclosed. This may prevent further shrinkage of the semiconductor devices, in order to accommodate the required landing area. If the via is not fully enclosed (i.e. borderless), then misalignment may result in the structure, as shown in FIG. 5. In this figure, tooth-shape region 18 may form. Since an over-etch is needed at the end of the oxide etch which forms the hole 10 (of FIG. 3), misalignment causes a continued etching well below the top of the local interconnection, forming a long narrow channel. Volatile material may remain at the bottom of this channel, causing eruptions during tungsten deposition. Furthermore, the large aspect ratio of this long narrow channel may impede tungsten deposition by CVD. If aluminum is deposited in the via rather than tungsten, a continuous seed layer may be difficult to form. The inclusion of a spacer formed of an etch-stop material on the edges of the local interconnections may help avoid these problems, but increases the cost of fabrication.

BRIEF SUMMARY

In a first aspect, the present invention is a method of making a semiconductor structure, comprising forming a hole through a first dielectric layer; followed by forming a hole through an etch-stop layer, to expose a first conducting layer. The thickness of the etch-stop layer is at least one-half the smallest line width of the first conducting layer.

In a second aspect, the present invention is a method of making a semiconductor structure, comprising forming an etch-stop layer on a first conducting layer; and forming a first dielectric layer on the etch-stop layer. The forming of the dielectric layer is carried out before patterning the etch-stop layer, and the thickness of the etch-stop layer is at least one-half the smallest line width of the first conducting layer.

In a third aspect, the present invention is a semiconductor structure, comprising a semiconductor substrate, gates on the substrate, a first dielectric layer on the gates, a first conducting layer on the first dielectric layer, an etch-stop layer on the first conducting layer, and a second dielectric layer on the etch-stop layer. The thickness of the etch-stop layer is at least one-half the smallest line width of the first conducting layer.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein.

DETAILED DESCRIPTION

The present invention includes a semiconductor structure which has an etch-stop layer on a lower conducting layer, preventing over-etching from forming a narrow channel at the bottom of a via. Consequently, after the via is formed in an interlayer dielectric layer, the etch-stop layer is then etched to expose the lower conducting layer. This inhibits formation of a tooth-shaped hole, and its associated disadvantages.

Figure 9:
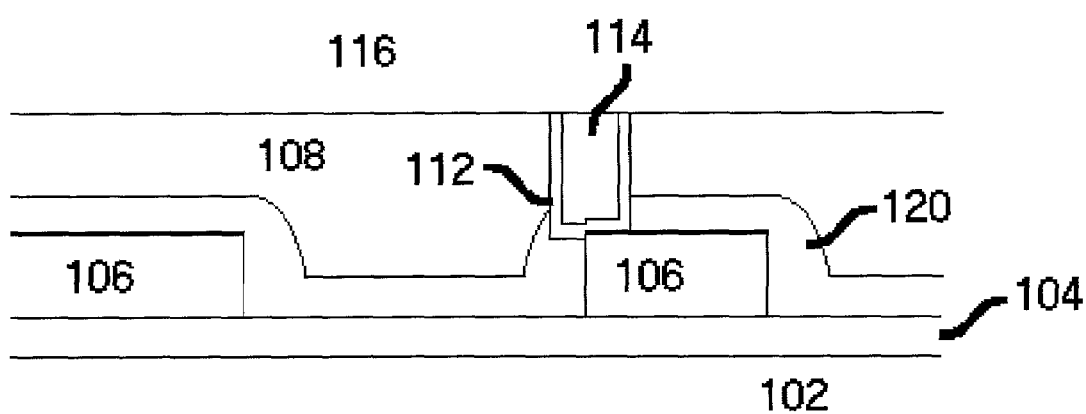
FIG. 9 illustrates an embodiment of the present invention.

FIG. 9 illustrates a structure of the present invention. In this figure a lower dielectric layer 102 is on a semiconductor substrate. An optional lower capping layer 104 is on the lower dielectric layer, and a lower conducting layer 106 is on the lower capping layer. An etch-stop layer 120 is on the lower conducting layer, as well as the lower dielectric layer and/or optional lower capping layer. An interlayer dielectric layer 108 is on the etch-stop layer, and an upper conducting layer 116 is on the interlayer dielectric layer. An electrical connection is formed between the upper and lower conducting layers by a via 114 and a liner 112. The lower conducting layer may be a local interconnecting layer; preferably, the lower conducting layer is not the gate of a transistor. However, if the lower conducting layer is a gate of a transistor, then the thickness of the etch-stop layer may be very thin on top of the gate, and only the spacer thickness needs to corresponds to a thickness of at least about one Lynch value (or at least one-half the smallest line width of the first conducting layer).

Figure 1:
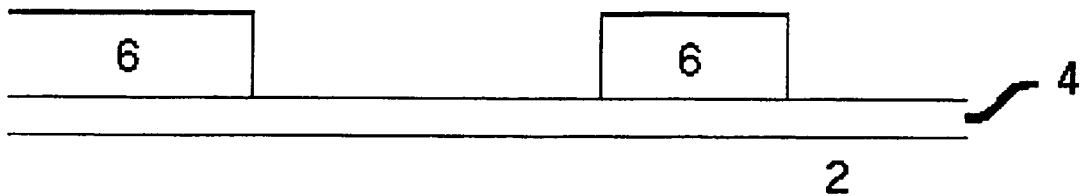
FIGS. 1–3 illustrate a method of forming the structure of FIG. 4.
Figure 2:
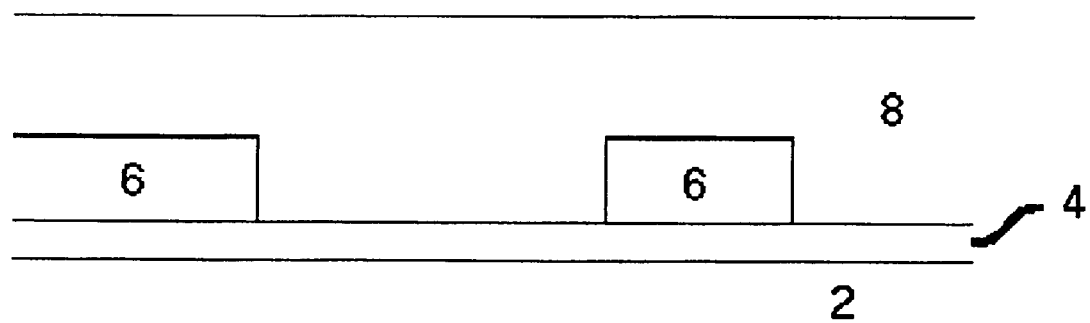
Figure 3:
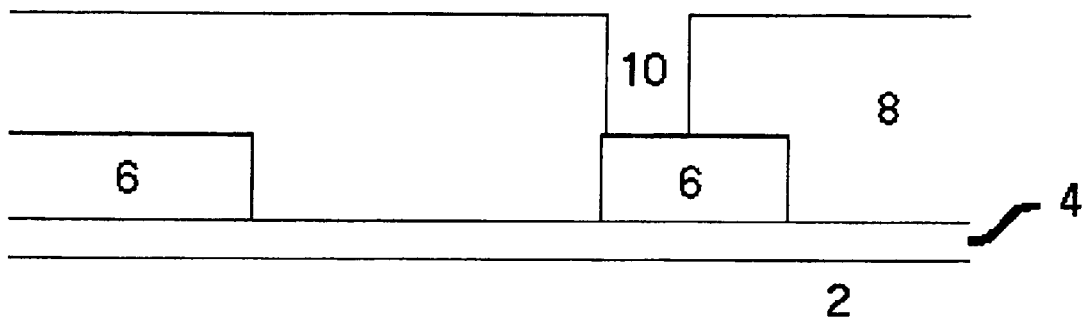
Figure 4:
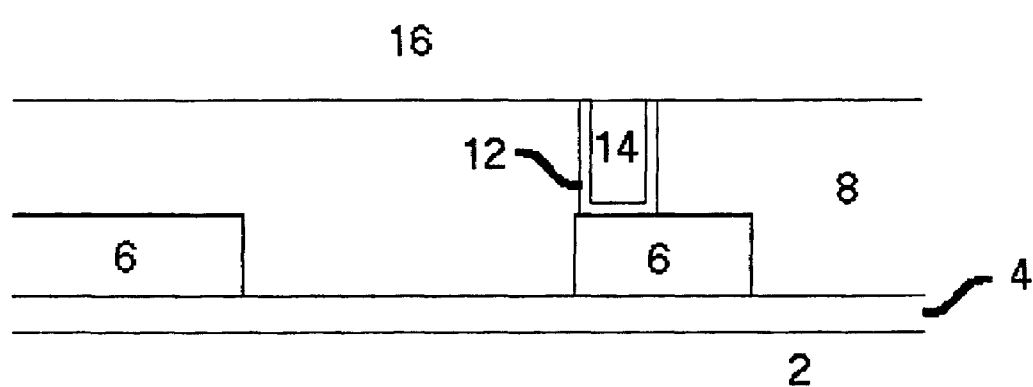
FIG. 4 illustrates a typical borderless contact structure, formed as designed.
Figure 5:
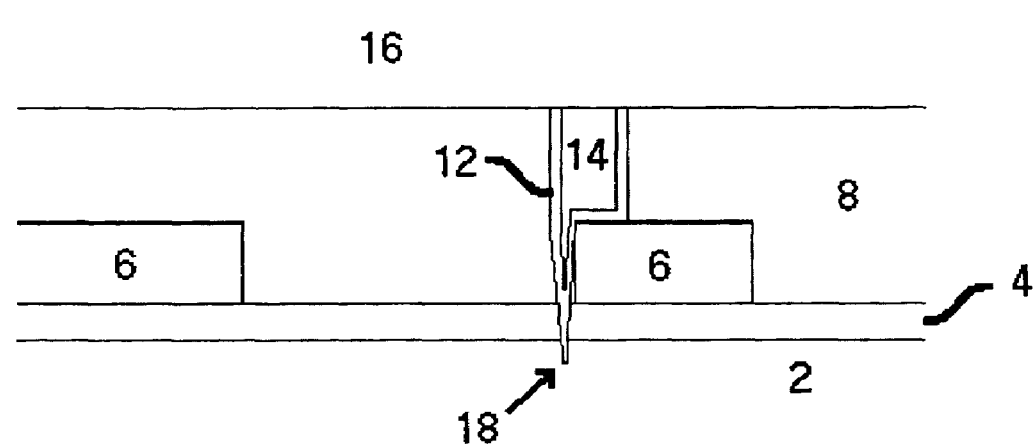
FIG. 5 illustrates a misaligned borderless contact structure.
Figure 6:
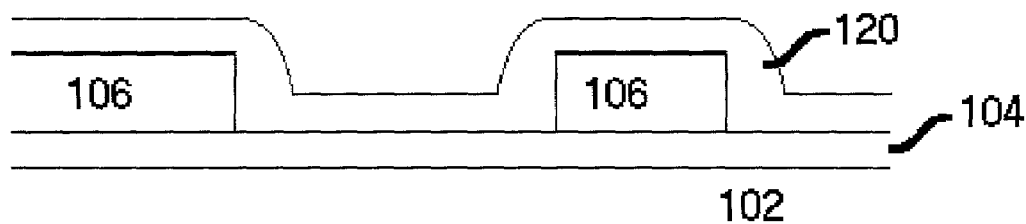
FIGS. 6–8 illustrate a method of forming the structure of FIG. 9.
Figure 7:
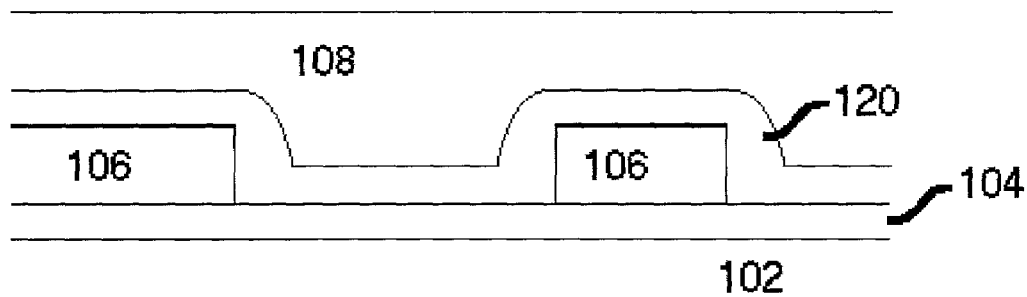
Figure 8:
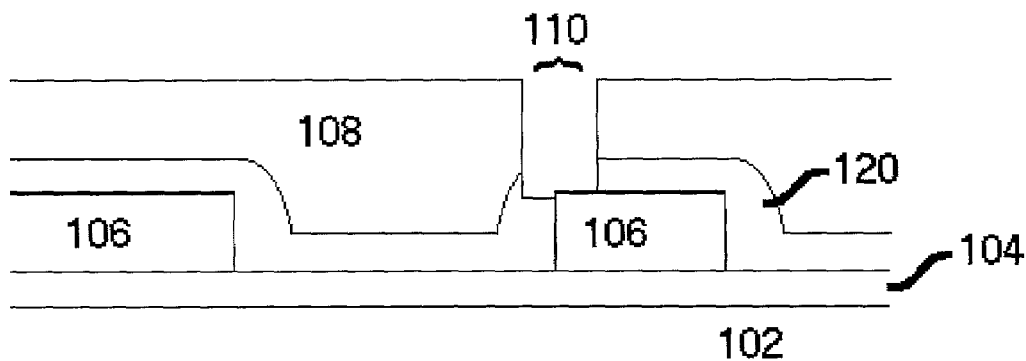

The structure of FIG. 9 may be formed by the method shown in FIGS. 6–8. On a structure including the lower dielectric layer 102, optional lower capping layer 104 and lower conducting layer 106, is formed an etch-stop layer 120, as shown in FIG. 6. Next, an interlayer dielectric layer 108 is deposited and planarized, as shown in FIG. 7; an optional interlayer capping layer may be included on the interlayer dielectric layer. Photoresist material is then applied and patterned, followed by etching the interlayer dielectric layer and removing the photoresist material, forming a hole 110 in the interlayer dielectric layer, shown in FIG. 8. Finally, the structure of FIG. 9 may be formed by lining the hole with the liner 112, filling the hole with conductive material to form the via 114, and forming the upper conducting layer 116. This upper conducting layer may be patterned. Additional interlayer dielectric layers, separating additional upper conducting layers, may also be included, optionally using the method illustrated in FIGS. 6–8 to form vias between the upper conducting layer and the additional upper conducting layers, as well as between the additional upper conducting layers. Also, antireflective coating (ARC) layers may also be included where appropriate, such as on the interlayer dielectric layer.

The thickness of the etch-stop layer is preferably controlled to about one Lynch value, for example from 0.06 to 0.13 microns, giving a sidewall thickness of for example 600 to 1300 angstroms. If the etch-stop layer is very thin, then it is possible for the over-etch used to form the hole to break through the etch-stop layer in a section of misalignment (i.e. along the sidewall of the lower conducting layer), producing a tooth-shaped hole. The thinnest width parallel to the substrate of the lower conducting layer (referred to as "smallest line width") correlates closely with the Lynch value, and therefore, preferably, the thickness of the etch-stop layer is at least one-half the smallest line width. Alternatively, if the etch-stop layer is very thick, then the dielectric constant will be larger, and this may adversely affect the capacitance of the system.

Preferably, the etch-stop layer is not etched to form spacers on the sides of the lower conducting layer. Accordingly, it is preferable to form the interlayer dielectric layer before etching the etch-stop layer; at least a portion of the etch-stop layer is between the lower conducting layer and the interlayer dielectric layer.

The conducting layers, including the lower conducting layer, the upper conducting layer, the additional conducting layers, the liner and the via, may include any conductive material. Examples of conductive materials include metals, alloys and/or highly doped semiconductor materials. A conductive material may include, for example, Al, Cu, Au, Ag, W, Ti, Zr, Mo, Pt, Ir, Pd, Mg, Ta, Cr, Ni, Si, Ge, alloys thereof, and compounds thereof. In one embodiment, the upper conducting layer and additional upper conducting layers may be prepared as described in "IMPROVED HOT METALLIZATION PROCESS" U.S. application Ser. No. 08/693,978, filed Aug. 1, 1996, hereby incorporated by reference. Preferably, the lower conducting layer includes titanium. In one embodiment, the lower conducting layer does not include Si, Ge, and/or semiconductor compounds; the lower conducting layer is preferably not a doped semiconductor, such as doped polycrystalline silicon. Preferably, the liner includes a conductive nitride, for example titanium nitride, which may be formed by CVD or ionized magnetic plasma (IMP) deposition. Preferably, the via includes tungsten, aluminum and/or copper.

The individual semiconductor processing steps used in accordance with the present invention (e.g., etching, CVD, etc.) are well known to those of ordinary skill in the art, and are also described in numerous publications and treatises, including: Encyclopedia of Chemical Technology, Volume 14 (Kirk-Othmer, 1995, pp. 677–709); Semiconductor Device Fundamentals by Robert F. Pierret (Addison-Wesley, 1996); Silicon Processing for the VLSI Era by Wolf (Lattice Press, 1986, 1990, 1995, vols 1–3, respectively); and Microchip Fabrication: A Practical Guide to Semiconductor Processing by Peter Van Zant ($4^{th}$ Edition, McGraw-Hill, 2000).

Any of the dielectric layers, including the lower dielectric layer, lower capping layer, interlayer dielectric layer, the interlayer capping layer and the etch-stop layer, may be made from any dielectric material conventionally known to those of ordinary skill in the art. The lower and interlayer dielectric layers, and their associated capping layers, may be the same or different. Examples include conventional oxides, nitrides, oxynitrides, and other dielectrics, such as borophosphosilicate glass (BPSG), borosilicate glass (BSG), phosphosilicate glass (PSG), fluorosilicate glass (FSG), spin-on glass (SOG), silicon oxides such as silicon dioxide, and silicon nitride; for example $SiO_2$, $Si_3N_4$, $Al_2O_3$, $SiO_xN_y$, etc. The interlayer and lower dielectric layers must be made from a material that is different from the etch-stop layer, unless a capping layer different from the etch-stop layer is present. The term "oxide" refers to a metal oxide conventionally used to isolate electrically active structures in an integrated circuit from each other, typically an oxide of silicon and/or aluminum (e.g., $SiO_2$ or $Al_2O_3$, which may be conventionally doped with fluorine, boron, phosphorous or a mixture thereof; preferably $SiO_2$ or $SiO_2$ conventionally doped with 1–12 wt % of phosphorous and 0–8 wt % of boron). Preferably, the lower dielectric layer and the lower capping layer are made of materials that can be etched with the same etching system. Similarly, the interlayer dielectric layer and the interlayer capping layer are preferably made of materials that can be etched with the same etching system. Preferably, the lower and interlayer dielectric layers include oxide, preferably silicon oxide. The etch-stop layer preferably comprises silicon nitride, silicon oxynitride, and/or silicon carbide.

The dielectric layers may be deposited by conventional methods known to those of ordinary skill in the art, such as by spin-on methods, sintering (which may further include sol-gel oxide formation), chemical vapor deposition, etc. A glass layer deposited by a chemical vapor deposition technique may be subject to a glass reflow step (e.g., by heating) to smooth, densify and further improve the contact between the protection layer and the substrate.

When a dielectric layer is to be etched, it is made from a material that can be etched more quickly than the etch-stop layer. If the dielectric layer is made from silicon oxide, or a glass, such as a silicon dioxide formed from TEOS or spin-on glass (SOG), it may be doped in order to enhance the selectivity for etching the glass or oxide instead of the etch-stop layer. Preferably, the etch selectivity (i.e., the ratio of (a) the rate of dielectric etching to (b) the rate of etch stop material etching) is at least 2:1, preferably at least 3:1, more preferably at least 5:1 and even more preferably at least 10:1.

Etching the deposited films may be conducted by conventional methods known to those of ordinary skill in the art. The specific etching method(s) and etchant(s) depend on the material being removed, the resist material and the compatibility of the etching material with the existing structure. Selection of suitable etching materials, resist materials and etching conditions, is within the level of ordinary skill in the art.

The interconnecting structure of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. In a semiconductor device, the device elements (transistors, diodes, etc., and the associated gates, sources, drains, substrates, etc.) would lie below the structures depicted in the figures. Furthermore, any of these semiconductor devices may be incorporated into an electronic device, for example a computer, an airplane or an automobile.

The substrate may typically be a semiconductor material conventionally known by those of ordinary skill in the art. Examples include silicon, gallium arsenide, germanium, gallium nitride, aluminum phosphide, and alloys such as $Si_{1-x}Ge_x$ and $Al_xGa_{1-x}As$, where $0 \leq x \leq 1$. Many others are known, such as those listed in Semiconductor Device Fundamentals, on page 4, Table 1.1 (Robert F. Pierret, Addison-Wesley, 1996). Preferably, the semiconductor substrate is silicon, which may be doped or undoped.

Numerous modifications and variations of the present invention are possible in light of the above teachings. It is therefore to be understood that within the scope of the appended claims, the invention may be practiced otherwise than as specifically described herein.

What is claimed is:

1. A method of making a semiconductor structure, comprising:
    forming a hole through a first dielectric layer; followed by extending the hole through an etch-stop layer, to expose a first conducting layer;
    wherein the thickness of the etch-stop layer in the smallest dimension is at least one-half the smallest line width of the first conducting layer.

2. The method of claim 1, further comprising:
    filling the hole with a conductive material, to form a via; and
    forming a second conducting layer, on the dielectric layer;
    wherein the via electrically connects the first and second conducting layers.

3. The method of claim 2, further comprising:
    forming a second dielectric layer, on the second conductive layer; and
    forming a third conducting layer, on the second dielectric layer.

4. The method of claim 2, further comprising:
    forming a capping layer, on the dielectric layer; and
    lining the hole with a liner, prior to the filling of the hole;
    wherein the capping layer is between the dielectric layer and the second conducting layer.

5. The method of claim 1, wherein the first conducting layer is a local interconnect layer.

6. The method of claim 2, wherein the first conducting layer comprises titanium,
    the second conducting layer comprises at least one member selected from aluminum and copper,
    the conductive material comprises at least one member selected from tungsten and aluminum,
    the first dielectric layer comprises oxide, and
    the etch-stop layer comprises nitride or oxynitride.

7. The method of claim 1, wherein the thickness of the etch-stop layer in the smallest dimension is about one Lynch value.

8. A method of making a semiconductor structure, comprising:
    forming an etch-stop layer on a first conducting layer; and
    forming a first dielectric layer on the etch-stop layer;
    wherein the forming of the dielectric layer is carried out before patterning the etch-stop layer, and
    the thickness of the etch-stop layer in the smallest dimension is at least one-half the smallest line width of the first conducting layer.

9. The method of claim 8, wherein the first conducting layer does not comprise a doped semiconductor.

10. The method of claim 9, further comprising:
    forming a hole through the first dielectric layer and the etch-stop layer;
    filling the hole with a conductive material, to form a via; and
    forming a second conducting layer on the first dielectric layer;

wherein the via electrically connects the first and second conducting layers.

11. The method of claim 10, further comprising:
forming a second dielectric layer, on the second conducting layer; and
forming a third conducting layer, on the second dielectric layer.

12. The method of claim 10, further comprising:
forming a capping layer, on the dielectric layer; and
lining the hole with a liner, prior to the filling of the hole;
wherein the capping layer is between the dielectric layer and the second conducting layer.

13. The method of claim 9, wherein the first conducting layer is a local interconnect layer.

14. The method of claim 13, wherein the first conducting layer comprises titanium,
the second conducting layer comprises at least one member selected from aluminum and copper, and
the conductive material comprises at least one member selected from tungsten and aluminum.

15. The method of claim 9, wherein the thickness of the etch-stop layer in the smallest dimension is about one Lynch value.

16. A method of making a semiconductor device, comprising:
making a semiconductor structure by the method of claim 1; and
forming a semiconductor device from the semiconductor structure.

17. A method of making an electronic device, comprising:
making a semiconductor device by the method of claim 16; and
forming an electronic device comprising the semiconductor device.

* * * * *